United States Patent
Hawryluk et al.

(10) Patent No.: US 8,796,151 B2
(45) Date of Patent: Aug. 5, 2014

(54) SYSTEMS FOR AND METHODS OF LASER-ENHANCED PLASMA PROCESSING OF SEMICONDUCTOR MATERIALS

(75) Inventors: Andrew M. Hawryluk, Los Altos, CA (US); Arthur W. Zafiropoulo, Atherton, CA (US)

(73) Assignee: Ultratech, Inc., San Jose, CA (US)

( * ) Notice: Subject to any disclaimer, the term of this patent is extended or adjusted under 35 U.S.C. 154(b) by 32 days.

(21) Appl. No.: 13/438,865

(22) Filed: Apr. 4, 2012

(65) Prior Publication Data

US 2013/0267096 A1 Oct. 10, 2013

(51) Int. Cl.
*H01L 21/302* (2006.01)

(52) U.S. Cl.
USPC ............. 438/708; 438/709; 438/719; 216/65

(58) Field of Classification Search
USPC ................. 156/345.4, 345.41, 345.42, 345.5; 438/706, 708, 709, 710, 712, 714, 716, 438/765; 216/65, 66, 67
See application file for complete search history.

(56) References Cited

U.S. PATENT DOCUMENTS

| | | |
|---|---|---|
| 4,624,736 A | 11/1986 | Gee et al. |
| 5,209,944 A | 5/1993 | Opower et al. |
| 5,997,963 A | 12/1999 | Davison et al. |
| 6,576,559 B2 | 6/2003 | Nakata et al. |
| 6,923,885 B2 | 8/2005 | Masuda et al. |
| 7,186,663 B2 | 3/2007 | Joshi et al. |
| 7,297,892 B2 | 11/2007 | Kelley et al. |
| 7,485,586 B2 | 2/2009 | Yamazaki et al. |
| 8,138,105 B2 * | 3/2012 | Timans ................. 438/799 |
| 2002/0088400 A1 | 7/2002 | Nakano et al. |
| 2006/0163527 A1 * | 7/2006 | Komatsu et al. ........ 252/62.3 R |
| 2007/0045252 A1 | 3/2007 | Kleine et al. |
| 2010/0025369 A1 | 2/2010 | Negishi et al. |
| 2010/0154558 A1 * | 6/2010 | Desplats et al. ............. 73/842 |

* cited by examiner

*Primary Examiner* — Lan Vinh
(74) *Attorney, Agent, or Firm* — Opticus IP Law PLLC

(57) ABSTRACT

Systems for and methods of laser-enhanced plasma processing of semiconductor materials are disclosed. The method includes supporting a semiconductor material in a processing chamber interior and subjecting the semiconductor material to a plasma process. The method also includes simultaneously heating the wafer surface with a laser beam through a window in the processing chamber to increase the reaction rate of the plasma process. Other methods include performing laser heating of the semiconductor material before or after the plasma process but while the semiconductor material resides in the same chamber interior.

18 Claims, 6 Drawing Sheets

SYSTEMS FOR AND METHODS OF LASER-ENHANCED PLASMA PROCESSING OF SEMICONDUCTOR MATERIALS

FIELD

The present disclosure relates generally to the processing of semiconductor materials, and in particular relates to systems for and methods of laser-enhanced plasma processing (LEPP) of semiconductor materials.

BACKGROUND ART

Plasma processing is a common procedure that is widely used in semiconductor manufacturing to modify the surface of a semiconductor material. For example, plasma processing is widely used for etching and depositing materials onto the surface of a semiconductor substrate or "wafer." Typically, the plasma is generated by a high-voltage discharge mechanism, and the ions created by this process are highly reactive. The ions can either etch the substrate, as in fluorine ions etching a silicon surface, or they can deposit material, as in metallic ions depositing metal onto the surface.

A deleterious side effect of plasma processing is the damage to the substrate surface created when the high-energy ions impact the surface. Because the plasma is typically within a high-voltage electric field, its ions are accelerated toward the substrate and strike the surface with substantial energy. These highly energetic ions are directional (typically, normal to the surface of the wafer) and can cause localized damage to the surface. This damage often results in semiconductor device performance degradation.

One way to reduce the impact of these energetic ions is to raise the voltage of the semiconductor substrate. This has the effect of reducing the velocity of the incident ions as they impact the surface of the wafer. Unfortunately, it also reduces the directionality, and hence often results in anisotropic etching of or depositing material onto the surface.

Another way to reduce the impact of the energetic ions of a plasma is to extract them from the plasma and allow them to flow "downstream" from the discharge in a neutral electric field onto the surface of the wafer. While this process significantly reduces the localized damage to the wafer, the etching and deposition rates are significantly reduced because the density of ions within the downstream neutral field is generally quite low.

There is also another issue with the plasma processing of wafers that relates to wafer throughput, which is the number of wafers per hour that can be processed by a given tool or in a given sequence of tools in forming a semiconductor device. In any semiconductor process, it is desirable to conduct that process as fast as possible and to move the wafer to the next process as fast as possible. It is desirable to reduce the amount of time a wafer spends being processed so that the wafer throughput for the particular tool or semiconductor manufacturing process can be maximized. In the case of plasma processing, it is time consuming to plasma process a wafer in a plasma processing system and then move the wafer out of the plasma processing system to the next system to carry out the next process.

SUMMARY

Aspects of the disclosure are directed to systems for and methods of performing plasma processing of semiconductor wafers in a manner that provides sufficient reaction rates for either deposition or etching that result in high throughput but that do not generate the high energies that damage the wafer surface. In exemplary embodiments, this is achieved by combining downstream plasma processing with irradiating the wafer surface with a laser beam to increase the wafer surface temperature so that the reaction rate is increased.

When the laser beam has sufficient energy to perform laser annealing of the wafer surface, the laser irradiation can be used to simultaneously enhance the plasma process while also performing laser annealing of the wafer surface to, for example, activate dopants and decrease device defect densities. In other embodiments, plasma processing and laser annealing are performed in sequence while the wafer resides in the same processing chamber so that the wafer does not need to be removed from the processing chamber. In examples, the wafer remains in place or is moved within the chamber from a first position to a second position. In another example, the wafer remains in one position.

Performing plasma processing and laser processing in a single processing chamber is facilitated by the use of a window that separates the chamber interior from the chamber exterior and that transmits the laser beam from the exterior to the interior over an optical path that extends from the chamber exterior (e.g., from a beam-shaping optical system) to the wafer surface of the wafer that resides within the interior.

An aspect of the disclosure is a system for performing laser-enhanced plasma processing of a semiconductor material having a surface. The system includes a processing chamber having an interior. The system also includes a support stage operably disposed in the chamber interior and configured to support the semiconductor material. The processing chamber has a window that separates the chamber interior from a chamber exterior and that is transparent to a laser wavelength. The system also includes a downstream plasma delivery system configured to deliver a plasma to the processing chamber interior and to the semiconductor material supported on the support stage to perform a plasma process. The system also has a laser beam delivery system configured to deliver a laser beam having the laser wavelength to the processing chamber interior through the window and to the semiconductor material surface to perform laser heating of the wafer surface.

Another aspect of the disclosure is a method of performing enhanced plasma processing of a semiconductor material having a surface. The method includes containing the semiconductor material surface in an interior of a downstream plasma processing chamber that has an exterior, an interior and a window that separates the exterior and the exterior, the interior being configured to support a plasma process. The method also includes subjecting the semiconductor material surface to the plasma process having a reaction rate representative of an etch or a deposition process. The method also includes simultaneously irradiating the semiconductor material surface with the laser beam that passes from the chamber exterior to the chamber interior through the window to increase the reaction rate of the plasma process.

Another aspect of the disclosure is a method of performing enhanced plasma processing of a semiconductor material. The method includes supporting a semiconductor material in an interior of a processing chamber, and subjecting the semiconductor material to a plasma process that has a reaction rate. The method also includes heating the semiconductor material during the plasma process by passing a laser beam from the chamber exterior to the chamber interior through a window in the processing chamber to increase the reaction rate. In an example, the heating increases the initial reaction rate of the plasma process by at least 100% (i.e., by at least a factor of 2×).

It is to be understood that both the foregoing general description and the following detailed description presented below are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

In some of the Figures, Cartesian coordinates are provided for the sake of reference and are not intended as providing limitations on specific directions and orientations of the systems and methods described herein.

The claims as set forth below are incorporated into and constitute part of this Detailed Description.

Any patent application or publication cited herein is incorporated herein by reference.

In the discussion below, the term "semiconductor substrate" and "wafer" are synonymous and used interchangeably. Likewise, the terms "semiconductor wafer surface" and "wafer surface" are synonymous and used interchangeably, with "wafer surface" being shorthand for "semiconductor wafer surface." The term "wafer" is shorthand for "semiconductor wafer" such as is used in the fabrication of integrated circuit devices. An exemplary wafer is a silicon wafer.

Also, the term "wafer surface" includes a thin layer of the underlying wafer body where reactions and changes to the semiconductor material typically occur during the semiconductor manufacturing process. Example reactions and changes include etching, deposition (depositing), dopant activation, defect annealing and the like.

The term "reaction rate" in connection with a plasma process refers to the rate at which material is either etched from the surface of the particular semiconductor material or deposited onto the surface of the semiconductor material. As described below, the plasma process has a reaction rate associated with just the plasma process alone and also has an enhanced or increased reaction rate due to the semiconductor material being heated by a laser beam.

Figure 1:
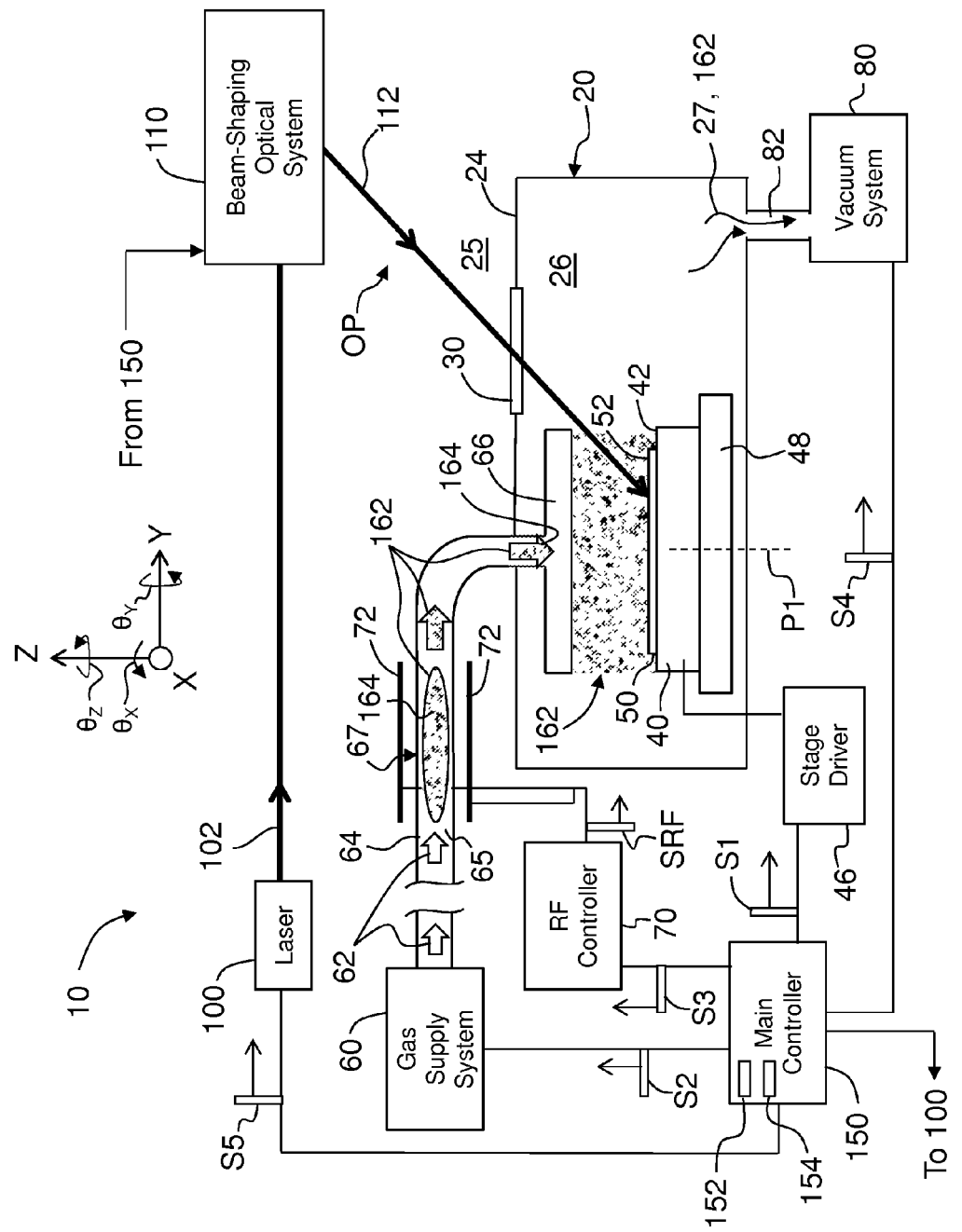
FIG. 1 is a schematic diagram of an example embodiment of a LEPP system according to the disclosure.

FIG. 1 is a schematic diagram of an example laser-enhanced plasma processing system ("LEPP system") 10. The LEPP system 10 includes a processing chamber 20 that includes a top chamber wall 24 and an interior 26 that is generally closed to the surrounding environment, which is referred to herein as chamber exterior 25. The processing chamber 20 includes a window 30 in top chamber wall 24 that resides between chamber exterior 25 and chamber interior 26. The window 30 is configured to transmit a laser beam 112 (introduced below) having a laser wavelength λ from chamber exterior 25 to chamber interior 26 over an optical path OP. In an example, the laser wavelength λ of laser beam 112 is one that allows for the laser beam to heat a semiconductor material such as silicon, and further in an example is one used to perform laser annealing of a semiconductor material, as described in detail below.

The LEPP system 10 includes in processing chamber interior 26 a support stage 40 that is positionable. In an example, support stage 40 is position in the X, Y and Z directions, as well as in the three corresponding angular directions $\theta_x$, $\theta_y$, and $\theta_z$ to provide six degrees of freedom of movement. The support stage 40 has a top surface 42 configured to support semiconductor material 50 to be processed. As semiconductor material 50 is usually in the form of a substrate or wafer, the semiconductor material is referred to herein below as wafer 50, which is the term typically used in the art. The wafer 50 has a wafer surface 52 that is supported face up on top surface 42 of support stage 40. The wafer surface 52 is the surface on which and through which wafer 50 is processed using the LEPP systems and methods described herein.

The support stage 40 is operably connected to a stage driver 46 that is configured to move and position the support stage within processing chamber interior 26, including placing wafer 50 at a first processing position P1 that is best suited to the processing of the wafer. In an example embodiment, support stage 40 is movably supported on a support structure (e.g., a plenum) 48 also within chamber interior 26 and on which the support stage can be moved and otherwise adjusted as needed.

The LEPP system 10 includes a gas supply system 60 that is pneumatically connected to processing chamber interior 26 via a gas conduit 64 that has an interior 65 and that is terminated by a nozzle 66. An example conduit 64 comprises a glass cylinder. The gas supply system 60 is configured to supply one or more gases 62. Example gases 62 include oxygen, nitrogen, fluorine, chlorine, bromine, $CHF_3$, $CF_4$, and any of the noble gases.

Electrodes 72 are operably disposed relative to gas conduit 64 and are electrically connected to a radio-frequency (RF) controller 70. The gas supply system 60, conduit 64, nozzle 66, RF controller 70 and electrodes 72 constitute a downstream plasma delivery system for delivering a plasma 162 to processing chamber interior 26, as explained in greater detail below.

The LEPP system 10 also has a vacuum system 80 pneumatically connected to processing chamber interior 26 via a conduit 82. The vacuum system 80 is configured to substantially remove air 27 from chamber interior 26 to create a partial vacuum within the chamber interior. The vacuum system 80 also removes plasma 162 from chamber interior 26 to maintain the partial vacuum as new plasma enters the chamber interior.

The LEPP system 10 further includes a laser 100 that emits laser light 102 having a wavelength λ. A beam-shaping optical system 110 is arranged downstream of laser 100 and is configured to receive and shape laser light 102 and form therefrom laser beam 112. In an example, laser 100 and beam-shaping optical system reside in chamber exterior 25, and laser beam 112 travels over optical path OP that passes from the chamber exterior to chamber interior 26 through window 30. Example beam-shaping optical systems 110 are described in U.S. Pat. Nos. 8,014,427 and 8,026,519. The laser 100 and beam-shaping optical system 110 constitute a laser beam delivery system. Example lasers for laser 100 include a $CO_2$ laser, a diode laser, a solid-state laser, a frequency-doubled solid-state laser and an excimer laser. Example laser wavelengths include 10.6 microns (e.g., for a $CO_2$ laser), 1.06 microns (e.g., for a solid-state laser), 500-600 nm (e.g., for a frequency-doubled solid-state laser), wavelengths between 800 and 1100 nm (e.g., for various solid-state diode lasers) and UV wavelengths between 193 and 500 nm (e.g., for various types of excimer lasers).

The example LEPP system 10 of FIG. 1 includes a main controller 150 that is electrically connected to one or more of stage driver 46, gas supply system 60, RF controller 70, vacuum system 80 and laser 100, and is configured to control the overall operation of LEP system 10 via one or more respective control signals S1, S2, S3, S4 and S5.

In an example, main controller 150 comprises a computer or like machine that is adapted (e.g., via instructions such as software embodied in a computer-readable or machine-readable medium) to cause the main controller to control the operation of the various components of system 10. The main controller 150 may include a processor unit ("processor") 152 and a memory unit ("memory") 154. An example controller 150 is or includes a computer with a processor and includes an operating system, such as Microsoft WINDOWS or LINUX.

In an example embodiment, processor 152 is or includes any processor or device capable of executing a series of software instructions and includes, without limitation, a general- or special-purpose microprocessor, a finite state machine, a controller, a computer, a central-processing unit (CPU), a field-programmable gate array (FPGA) and/or a digital signal processor.

The memory 154 is operably connected to processor 152. As used herein, the term "memory" refers to any processor-readable medium, including but not limited to RAM, ROM, EPROM, PROM, EEPROM, disk, floppy disk, hard disk, CD-ROM, DVD or the like, on which may be stored a series of instructions executable by processor 152.

The laser-enhanced plasma processing methods described herein may be implemented in various embodiments in a machine-readable medium (e.g., memory 154) comprising machine-readable instructions (e.g., computer programs and/or software modules) for causing main controller 150 to perform the methods described herein by controlling the operation of system 10. In an example embodiment, the computer programs run on processor 152 out of memory 154.

The computer programs and/or software modules may comprise multiple modules or objects to perform the various methods of the present invention, and control the operation and function of the various components in LEPP system 10. The type of computer programming languages used for the code may vary from procedural code-type languages to object-oriented languages. The files or objects need not have a one-to-one correspondence with the modules or method steps described. Further, the method and apparatus may comprise combinations of software, hardware and firmware. Firmware can be downloaded into processor 152 for implementing the various example embodiments disclosed herein.

In the operation of the example LEPP system 10 of FIG. 1, main controller 150 sets support stage 40 (with wafer 50 supported thereon) in the processing position P1 by sending control signal S1 to stage driver 46. With support stage 40 so arranged, main controller 150 sends control signal S2 to gas supply system 60, thereby causing the gas supply to release one or more gases 62, which then travel in conduit 64 toward nozzle 66.

In the meantime, main controller 150 sends control signal S3 to RF controller 70, which sends an RF signal SRF to electrodes 72. In response, electrodes 72 generate an RF field within interior 65 of gas conduit 64 in a region 67 that corresponds to the location of the electrodes. This serves to ionize gas 62 and creates the aforementioned plasma 162, which is made up of ions 164. It may be necessary to ignite the plasma with a high voltage source (not shown) similar to a spark plug or a tesla coil, as is known in the art.

Once created, plasma 162 flows down interior 65 of conduit 64 to nozzle 66. The vacuum system 80 (via the direction of control signal S4) creates a partial vacuum in processing chamber interior 26 by removing air 27 and plasma 162 from the interior. This gives rise to a pressure differential between plasma generation region 67 and wafer surface 52. This pressure differential causes plasma 162 to flow toward and be incident upon wafer surface 52. Thus, the downstream plasma delivery system delivers plasma 162 to wafer surface 52.

At this point, those ions 164 in plasma 162 that are incident upon wafer surface 52 typically have a low voltage and a low ion density, though their path from nozzle 66 to the wafer surface is fairly directional (i.e., substantially normally incident) due to the pressure differential. As a result, the reactions at wafer surface 52 are mostly chemical in nature and relatively selective and thus have a reaction rate RR that tends to be very low due to the low ion density.

The reaction rate RR at wafer surface 52 can be approximated by a simple rate law:

$$RR \propto \rho \cdot \exp[(kT/E_a)], \quad (EQ. 1)$$

where $\rho$ is the density of plasma 162, k is the Boltzmann constant, T is the temperature of the reaction and $E_a$ is an activation energy. At room temperature, T is approximately 320° K.

However, aspects of the disclosure include simultaneously irradiating wafer surface 52 with laser beam 112 to enhance the plasma process, and in particular to increase the reaction rate RR. In example embodiments, the laser irradiation includes providing laser beam 112 with sufficient energy to perform laser annealing (also referred to in the art as laser spike annealing or laser thermal processing). Example laser annealing systems and methods are disclosed in U.S. Pat. Nos. 7,098,155; 6,825,101; 6,747,245; and 6,531,681.

Thus, with continuing reference to FIG. 1, main controller 150 sends control signal S5 to laser 100, which causes the laser to emit light 102. This light is received by beam-shaping optical system 110, which as described above forms light beam 112 having the laser wavelength λ and that travels over optical path OP through window 30 and to wafer surface 52. Thus, the laser beam delivery system delivers laser beam 112 so that it irradiates wafer surface 52.

Figure 2:
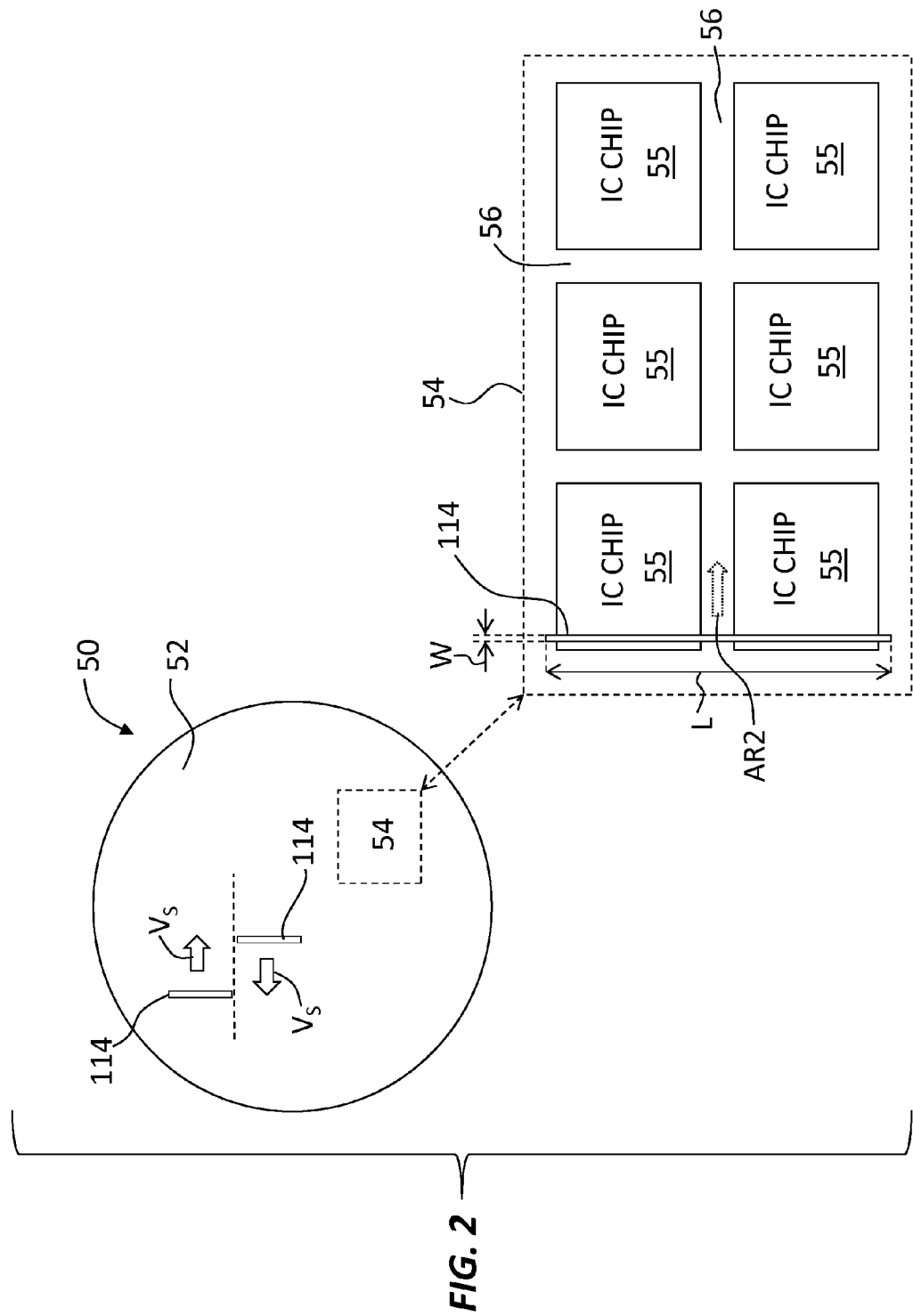
FIG. 2 is a plan view of an example wafer formed from a semiconductor material, and illustrates in a close-up inset an example configuration of the wafer surface that includes integrated circuit (IC) chips, with an example line image from the laser beam being scanned over the IC chips.

FIG. 2 is a plan view of wafer 50 and wafer surface 52. In an example, laser beam 112 forms a line image 114 on wafer surface 52. The line image 114 has a width W and a length L. A typical length L is in the range from 5 mm to 20 mm. A typical width W (which in an example is defined by the full-width half-maximum of a Gaussian intensity profile) is in the range from about 0.05 mm to about 2 mm.

The line image 114 scans over wafer surface 52 at a scan velocity $V_S$ by the movement of support stage 40, by the deflection of laser beam 112 by beam-shaping optical system 110, or by a combination of these effects. The amount of time that laser beam 112 resides over a point on wafer surface 52 is the dwell time τ. The dwell time r is defined by scan velocity $V_S$ and width W of line image 114 (i.e., $\tau = W/V_S$). Typical dwell times τ can be as short as 1 microsecond, or as long as hundreds of milliseconds. The dwell time τ is selected to achieve a select wafer surface temperature T. Higher wafer surface temperatures T produce higher (faster) plasma processing rates and require greater (longer) dwell times τ.

FIG. 2 also includes a close-up inset view that shows an example region 54 of wafer surface 52. The region 54 includes integrated circuit (IC) chips 55 in the process of being fabricated. The IC chips 55 are separated by kerf regions 56. In an example, line image 114 scans over IC chips 55 (e.g., two rows at a time, as shown), as shown by the arrow.

Laser annealing is used in semiconductor manufacturing to improve dopant activation, reduce defect densities, and improve contact resistance in semiconductor devices. The systems and methods of the present disclosure include performing a laser annealing step simultaneously with, before or after the plasma processing step.

The laser annealing provided by laser beam 112 heats wafer surface 52 from a low temperature $T_L$ to a high temperature $T_H$, which in an example is in the range from 1000° K to 1600° K, though in another example $T_H$ can be in the range from 600° K to 1600° K, and in yet another example can be in the range from 500° K to 1600° K.

At these higher temperatures $T_H$, the plasma reaction rate RR is substantially higher than it is at room temperature. If $T_L = T_R$ is the temperature of wafer surface 52 substantially at room temperature where the plasma process is usually carried out, and $T_H$ is the aforementioned wafer surface temperature T at a higher temperature, such as associated with a laser annealing process, then (assuming constant plasma densities at the two temperatures) the ratio of the reaction rates $RR_L$ ("reaction rate at low temperature") and $RR_H$ ("reaction rate at high temperature") is:

$$RR_H/RR_L = [\exp(kT_H/E_a)]/[\exp(kT_R/E_a)] \quad \text{(EQ. 2)}$$

This expression reduces to:

$$\exp\{(kT_R/E_a)\cdot[(T_H/T_R)-1]\} \quad \text{(EQ. 3)}$$

Equation 3 is equal to the original reaction rate raised to the power of $[(T_H/T_R)-1]$. For $T_H=1600°$ K and $T_R=300°$ K, this exponent is 4.33. For $T_H=900°$ K and $T_R=300°$ K, the exponent is 2, which also represents a substantial rate increase (i.e., $e^2 \approx 7.4$). Likewise, for $T_H=600°$ K and $T_R=300°$ K, the exponent is 1, which also represents a substantial rate increase (i.e., $e^1 \approx 2.72$). For $T_H \approx 508°$ K and $T_R=300°$ K, the exponent is about 0.693, which also represents a reaction rate increase of 100% (i.e., $e^{0.693} \approx 2$). Thus, in an example embodiment, $T_H$ is selected to increase the (initial or unenhanced) plasma reaction rate by at least 100% (i.e., by 100% or greater).

The selection of the higher temperature $T_H$ depends on a number of factors, such as the desired increase in the processing rate, the thermal budget available, the type of semiconductor device being manufactured, the make up of the semiconductor material, the nature of the plasma process (etch or deposition), and like factors.

Thus, by combining the selectivity and directionality of downstream plasma processing with laser heating, the reaction rate RR of the plasma process is substantially increased, which in turn increases wafer throughput. Thus, an aspect of the disclosure includes providing laser heating of wafer surface 52 to increase the initial or unenhanced (first) plasma process reaction rate $RR_L$ to an increased or enhanced (second) value $RR_H$ that is greater than the original (first) reaction rate $RR_L$.

Besides increasing the reaction rate, by appropriately selecting the wafer surface temperature T and dwell time r of laser beam 112, laser annealing can also be used to simultaneously perform at least one of dopant activation, defect annealing and (ohmic) contact resistance formation along with the downstream plasma process that either etches material from or deposits material onto wafer surface 52.

The above example method of operation of LEPP system 10 involves simultaneously plasma processing and laser heating wafer surface 52 to achieve LEPP. In an alternate example method of LEPP using LEPP system 10 of FIG. 1, wafer surface 52 is plasma processed and then afterward the wafer surface is laser heated, e.g., laser annealed. In another example, wafer surface 52 is laser heated (e.g., laser annealed) and then afterward is plasma processed.

In these cases where the plasma processing and the laser heating are not performed simultaneously to increase reaction rate RR of the plasma process, the plasma processing and the laser heating steps can be performed close in time so that wafer throughput is enhanced. Thus, the concept of the plasma processing being "laser enhanced" includes the improvement associated with being able to perform plasma processing and laser annealing close in time, i.e., within a few seconds of each other, as well as performing both simultaneously. This is enabled by performing both plasma processing and laser heating of wafer surface 52 in the same processing chamber interior 26.

Figure 3A:
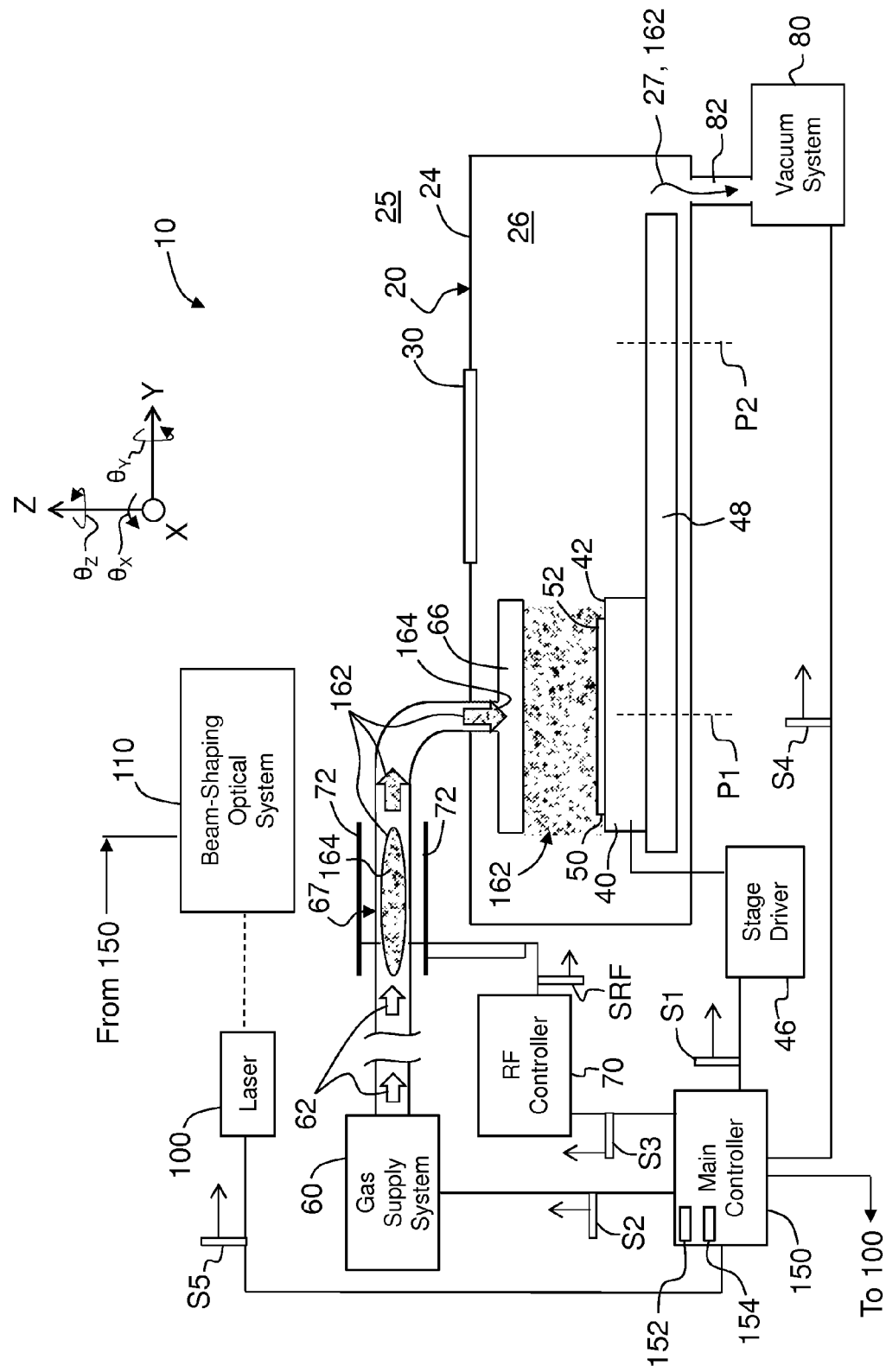
FIG. 3A and FIG. 3B are similar to FIG. 1 and illustrate an example LEPP system wherein the plasma processing and laser processing are performed with the support stage being at different positions within the processing chamber.
Figure 3B:
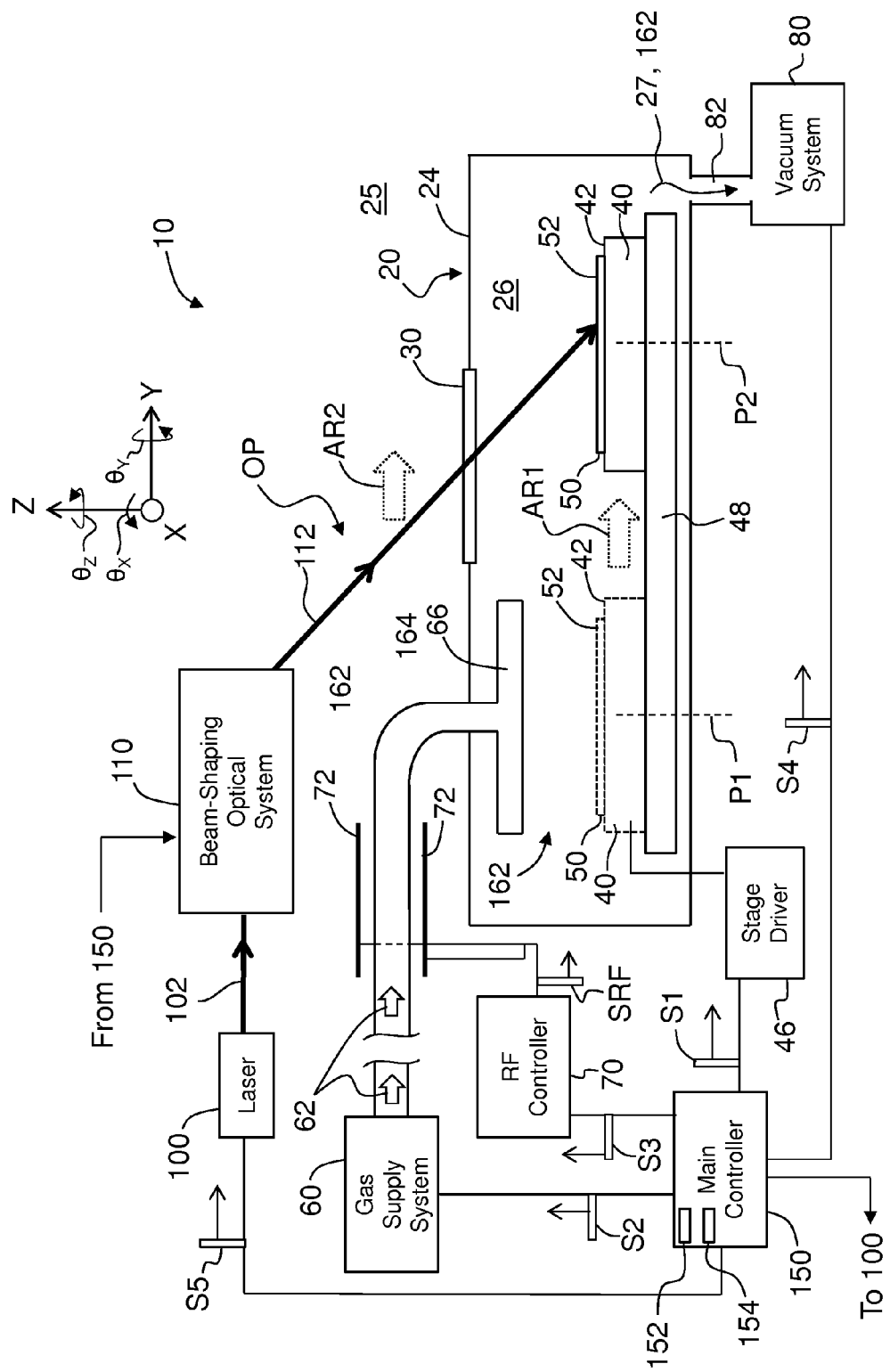

FIGS. 3A and 3B are similar to FIG. 1 and show an example LEPP system 10 where support stage 40 can be moved to a second processing position P2 within processing chamber interior 26. In an example, this is accomplished by main controller 150 sending control signal 51 to stage driver 46, which then moves support stage 40 from first processing position P1 to second processing P2. The window 30 is located such that at second processing position P2, wafer surface 52 resides in optical path OP. This allows for laser heating of wafer surface 52 to be carried out using laser beam 112 when wafer 50 is moved to second processing position P2.

Thus, in an example operation, with reference first to FIG. 3A, plasma processing of wafer surface 52 is carried out first at first processing position P1, after which support stage 40 is moved to second processing position P2, where laser heating of the wafer surface is carried out, as shown in FIG. 3B. The operation can also be carried out in the reverse order so that laser heating is performed first at second processing position P2 (FIG. 3B) and plasma processing is performed second at first processing position P1 (FIG. 3A).

Figure 4:
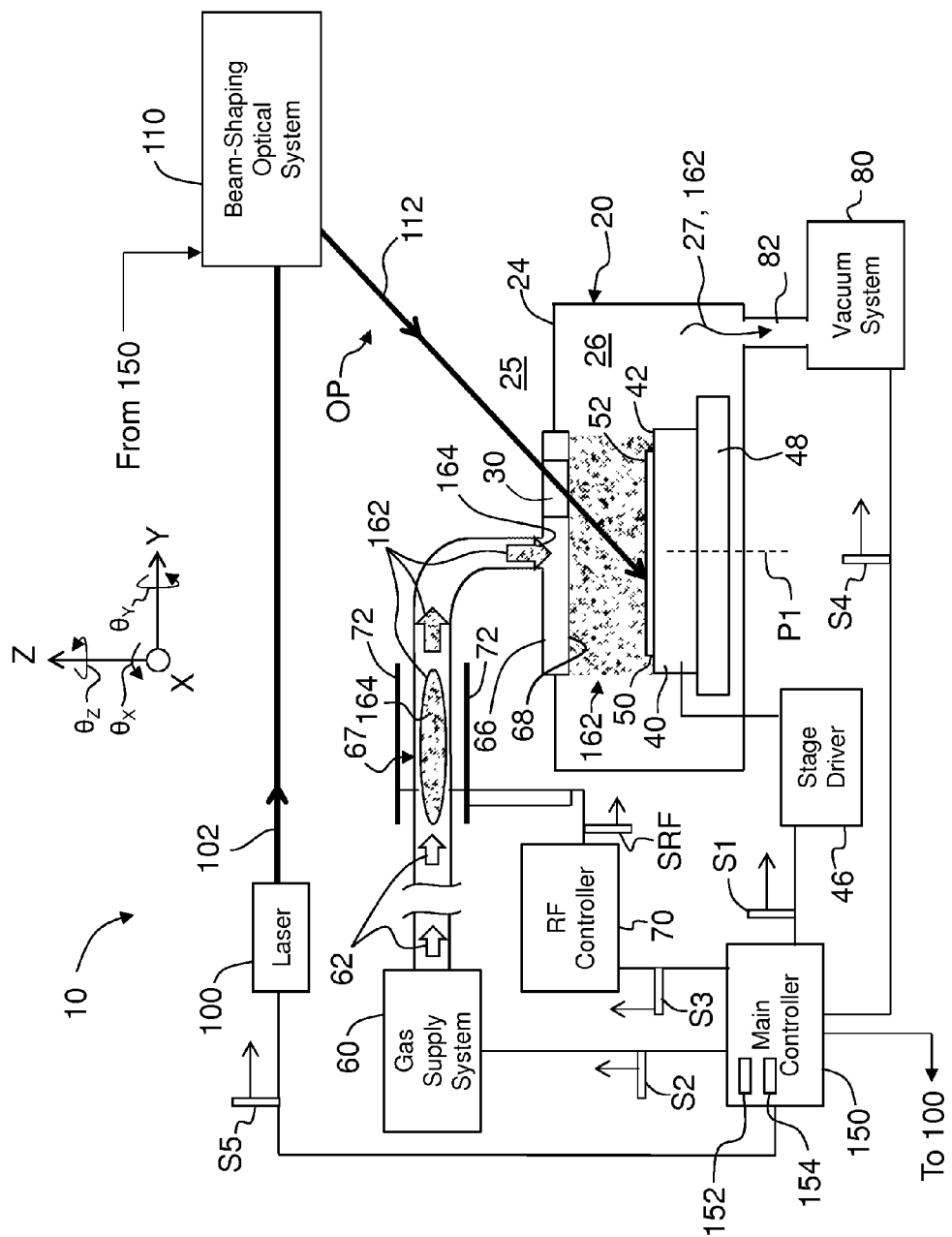
FIG. 4 is similar to FIG. 1 and illustrates an example LEPP system wherein the nozzle defines a portion of the processing chamber, and wherein the window is formed in the nozzle so that the laser beam can pass through the window and into the processing chamber interior.

FIG. 4 is similar to FIG. 1 and illustrates an example embodiment wherein nozzle 66 defines at least part of top wall 24 of processing chamber 20 and includes window 30 as well as a lower surface portion 68. This allows for a more compact design for LEPP system 10.

Figure 5:
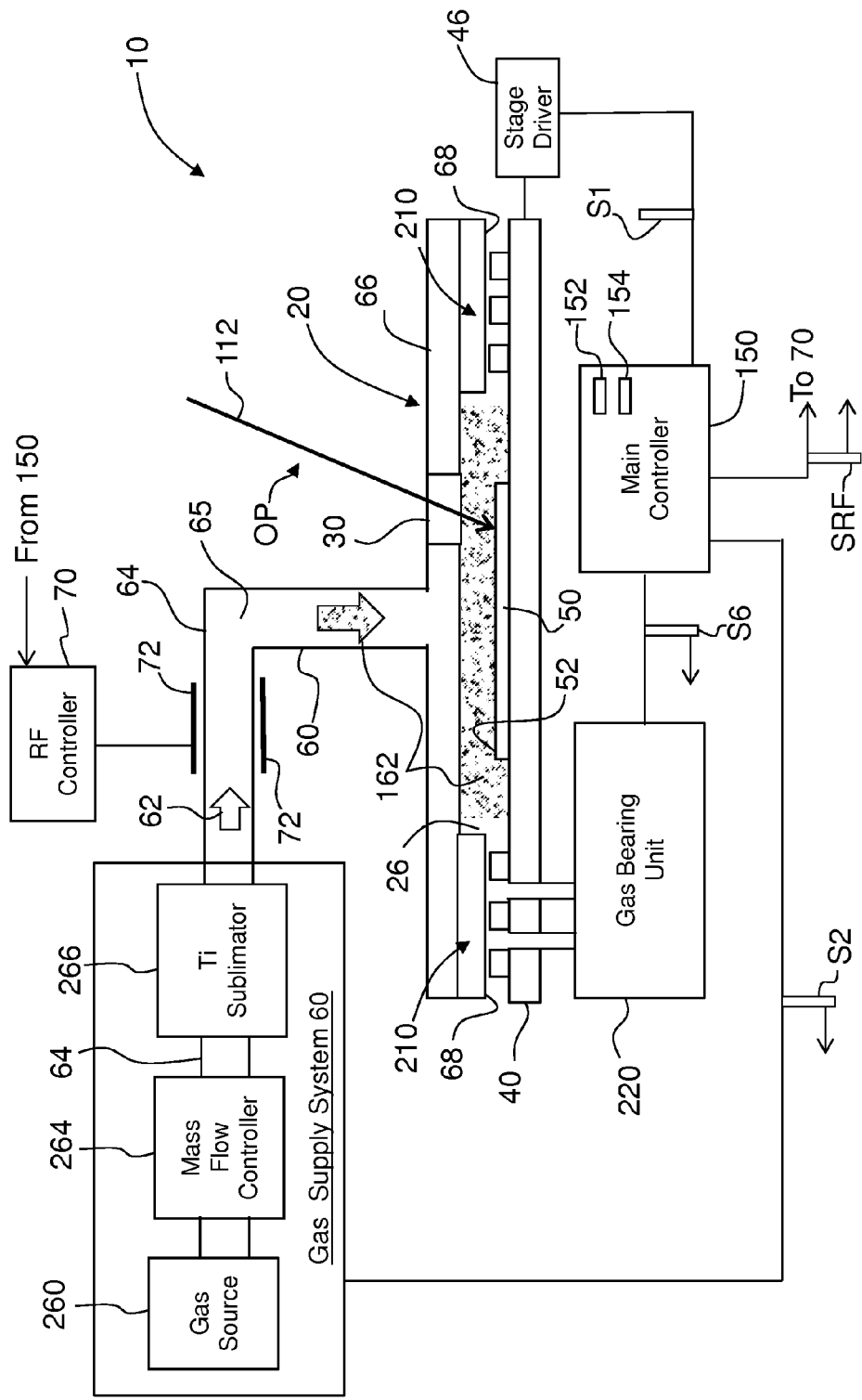
FIG. 5 is a schematic diagram of the main components of an example LEPP system wherein the processing chamber is configured as a microchamber.

In an example embodiment, processing chamber 20 can be configured as a microchamber, such as is described in U.S. Pat. No. 5,887,963 (hereinafter, the '963 patent), with the appropriate modifications. FIG. 5 is a schematic diagram similar to FIG. 4 and shows an example LEPP system 10 wherein processing chamber 20 is configured as a microchamber along the lines disclosed in the '963 patent, albeit shown in simplified form to facilitate the discussion.

The processing chamber 20 of FIG. 5 includes gas bearings 210 operably connected to a gas bearing unit 220 that includes, for example, one or more pressurized gases sources, regulators, a vacuum source, and an exhaust unit (not shown; see FIG. 1 of the '963 patent). The gas-bearing unit 220 is electrically connected to main controller 150 and is controlled via a control signal S6. The gas bearings 210 interface with lower surface portion 68 of nozzle 66. The gas bearings 210 serve to maintain a select distance between wafer surface 52 and nozzle 66 while gas-bearing unit 220 creates a partial vacuum within interior 26 of processing chamber 20. The stage 40 rides on lower surface portion 68 when the stage is used to move wafer 50 within processing chamber interior 26 under the control of stage driver 46, which is analogous to "positioner 33" in FIG. 1 of the '963 patent.

FIG. 5 also shows an example gas supply system 60 that includes a gas source 260, a mass flow controller 264, and a titanium (Ti) sublimator 266, all operably arranged along gas conduit 64. The gas source 260 contains one or more gases 62, while mass flow controller 264 is configured to control the flow of the one or more gases within conduit interior 65. The Ti sublimator 266 is used to reduce the amount of oxygen and water in gas conduit 64.

The mass flow controller 264 is used to control the partial pressures of the component gases in plasma 162. Plasma 162 can contain buffer gases as well as reactive gases. The buffer gases are often inert gases. In such a case, the partial pressures of the reactive gases relative to the buffer gases are controlled to achieve the desired balance of constituents in plasma 162.

In some semiconductor processes, the presence of oxygen is undesirable. Oxygen can oxidize wafer surface 52 and, in some cases, this oxidation inhibits the desired plasma process. The Ti sublimator 266 thus serves to reduce the amount of oxygen in plasma 162 by trapping oxygen that is present in gas conduit 64 before the oxygen can reach plasma generation region 67.

In an example embodiment, LEPP system 10 is used to perform a plasma process with plasma 162 to clean wafer surface 52 prior to performing a laser annealing process with laser beam 112 or prior to performing another plasma process. An example plasma 162 for cleaning purposes can be made using oxygen as gas 62. In this case, Ti sublimator 266 is deactivated to allow for oxygen to flow to plasma generation region 67.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A method of performing enhanced plasma processing of a semiconductor material having a surface, comprising:
   containing the semiconductor material surface in an interior of a downstream plasma processing chamber that has an exterior and a window that separates the exterior and the interior, the interior being configured to support a plasma process;
   subjecting the semiconductor material surface to the plasma process having a reaction rate representative of an etch or deposition process; and
   simultaneously with the plasma process, irradiating the semiconductor material surface with a laser beam that passes from the chamber exterior to the chamber interior through the window, wherein the laser beam forms a line image that scans over and locally heats the semiconductor material surface to a select temperature that locally increases the reaction rate of the plasma process.

2. The method of claim 1, further comprising providing the laser beam with sufficient energy to perform either deposition or etching of the semiconductor surface.

3. The method of claim 1, wherein the processing chamber comprises a microchamber.

4. The method of claim 1, wherein the increase in the reaction rate of the plasma process is 100% or greater.

5. The method of claim 1, further comprising providing the laser beam with sufficient energy to perform laser annealing of the semiconductor material surface.

6. The method of claim 5, further comprising the laser annealing causing at least one of dopant activation, defect annealing and Ohmic contact formation of the semiconductor material.

7. A method of performing enhanced plasma processing of a wafer made of a semiconductor material having a surface, comprising:
   containing the wafer in a downstream plasma processing chamber having an exterior, an interior and a window therebetween, with the interior configured to support a plasma process that has a reaction rate;
   subjecting the semiconductor material surface of the wafer to the plasma process; and
   simultaneous with the plasma process, irradiating the semiconductor material surface of the wafer with a laser beam from the chamber exterior to the chamber interior over an optical path that passes through the window, wherein the laser beam forms a line image that scans over and locally heats the semiconductor material surface to a select temperature that locally increases the reaction rate of the plasma process.

8. The method of claim 7, wherein the laser process comprises laser annealing of the semiconductor material.

9. The method of claim 7, further comprising moving the wafer within the chamber interior and relative to the laser beam to effectuate said scanning of the laser beam over the semiconductor material surface of the wafer.

10. The method of claim 7, further comprising delivering the plasma into the processing chamber interior through a nozzle, and wherein the window resides in the nozzle.

11. The method of claim 7, wherein the processing chamber comprises a microchamber.

12. The method of claim 7, wherein the local increase in the reaction rate occurs at a high temperature $T_H$ and is at least twice an initial reaction rate associated with a low temperature $T_L$.

13. A method of performing enhanced plasma processing of a wafer made of a semiconductor material, comprising:
   supporting a semiconductor material in an interior of a processing chamber;
   subjecting the semiconductor material to a plasma process that has a low-temperature reaction rate $RR_L$ at a low temperature $T_L$; and
   locally heating the semiconductor material during the plasma process to a high temperature $T_H$ by passing a laser beam from a chamber exterior to the chamber interior through a window in the processing chamber and scanning a line image formed by the laser beam over the semiconductor material, wherein the high temperature $T_H$ defines a high-temperature reaction rate $RR_H$ that is greater than the low-temperature reaction rate $RR_L$.

14. The method of claim 13, wherein the plasma process includes either etching or depositing.

15. The method of claim 13, wherein the laser beam has sufficient energy to perform at least one of dopant activation and defect correction in the semiconductor material.

16. The method of claim 13, wherein the local heating causes the high-temperature reaction rate $RR_H$ to be greater than the low-temperature reaction rate $RR_L$ by at least 100%.

17. The method of claim 13, wherein the processing chamber is configured as a microchamber.

18. The method of claim 13, further comprising the window being formed in a nozzle that defines a portion of the processing chamber.

\* \* \* \* \*